US007777331B2

(12) United States Patent
Kurita

(10) Patent No.: US 7,777,331 B2
(45) Date of Patent: Aug. 17, 2010

(54) SEMICONDUCTOR APPARATUS COMPRISING A SEMICONDUCTOR CHIP WITH A POWER SUPPLY CIRCUIT AND A SMOOTHING CIRCUIT DISPOSED OUTSIDE THE SEMICONDUCTOR CHIP

(75) Inventor: Kozaburo Kurita, Ome (JP)

(73) Assignee: Hitachi, Ltd., Tokyo (JP)

( * ) Notice: Subject to any disclaimer, the term of this patent is extended or adjusted under 35 U.S.C. 154(b) by 482 days.

(21) Appl. No.: 11/761,764

(22) Filed: Jun. 12, 2007

(65) Prior Publication Data
US 2007/0300092 A1 Dec. 27, 2007

(30) Foreign Application Priority Data
Jun. 12, 2006 (JP) ............................. 2006-161787

(51) Int. Cl.
*G06F 1/00* (2006.01)
*H01L 23/48* (2006.01)

(52) U.S. Cl. .......................... 257/724; 257/E23.079; 257/723; 257/725; 257/728; 257/685; 257/528; 257/777; 257/686; 713/323

(58) Field of Classification Search ................. 257/723, 257/724, 725, 728, 685, 777, E23.079, 532, 257/528, 686; 713/323
See application file for complete search history.

(56) References Cited

U.S. PATENT DOCUMENTS

| 6,396,137 | B1 * | 5/2002 | Klughart ..................... 257/691 |
| 6,469,895 | B1 * | 10/2002 | Smith et al. ................. 361/704 |
| 2001/0054760 | A1 | 12/2001 | Ito et al. |
| 2002/0042902 | A1 | 4/2002 | Yamamoto et al. |
| 2007/0075815 | A1 * | 4/2007 | Lotfi et al. ................... 336/200 |

* cited by examiner

*Primary Examiner*—Alexander O Williams
(74) *Attorney, Agent, or Firm*—Miles & Stockbridge P.C.

(57) ABSTRACT

A semiconductor apparatus including built-in power supply circuits capable of supplying a large current with high voltage accuracy. The semiconductor apparatus includes a semiconductor chip including a circuit area and power supply circuits, coils and capacitors. The semiconductor chip, coils and capacitors are provided in a package. Each power supply circuit, a coil and a capacitor compose a switching regulator. The semiconductor chip and the package are connected such that a power supply voltage which will be produced by the switching regulator is supplied to the circuit area. The power supply circuit is supplied with a power supply voltage from the outside of the semiconductor apparatus.

17 Claims, 8 Drawing Sheets

US 7,777,331 B2

SEMICONDUCTOR APPARATUS COMPRISING A SEMICONDUCTOR CHIP WITH A POWER SUPPLY CIRCUIT AND A SMOOTHING CIRCUIT DISPOSED OUTSIDE THE SEMICONDUCTOR CHIP

INCORPORATION BY REFERENCE

The present application claims priority from Japanese application JP2006-161787 filed on Jun. 12, 2006, the content of which is hereby incorporated by reference into this application.

BACKGROUND OF THE INVENTION

The present invention relates to semiconductor apparatus and more particularly to a semiconductor apparatus that includes a package on which are mounted a plurality of pairs of a coil and a capacitor, each pair composing a smoothing circuit of a switching regulator.

Recently, semiconductor devices are miniaturized, and thus, the semiconductor integrated circuits tend to be highly integrated and operate at increasing speeds. This miniaturization lowers electrical strength of the devices and hence decreases the power supply voltages. This suppresses an increase in the power consumption to some extent while causing a large increase in the power supply current. The transistors whose operating voltages are lowered have a reduced operating margin for the power supply voltage. When the power supply voltage is lowered compared to a desired value, there is a possibility that the operating speeds of the semiconductor device will be greatly reduced. Thus, the power supply circuit that supplies the power supply voltage to the semiconductor integrated circuit is required to supply a large current with high voltage accuracy.

To this end, a POL (Point Of Load) system is proposed in which the power supply circuit is disposed in the vicinity of the semiconductor integrated circuit that consumes power and in its final form the semiconductor integrated circuit should include the power supply circuit built therein.

Conventional techniques for building power supply circuits in the semiconductor integrated circuit are disclosed in the following publications.

i) US2002/0042902 A1
ii) US2001/0054760 A1

SUMMARY OF THE INVENTION

The above conventional techniques disclose building in a semiconductor chip a power supply circuit of a switching regulator. According to these techniques, a controller and an output unit that compose the power supply circuit are built in the semiconductor chip whereas the coil and capacitor that compose a smoothing circuit are disposed outside the semiconductor chip. In order for the switching regulator to supply a large current, an electrical connection between the output unit and the coil, and an electrical connection between the coil and a circuit that consumes electric power are required to be strengthened.

In accordance with the present invention, a semiconductor apparatus comprises a semiconductor chip including a first circuit area and a first power supply circuit, a first coil and a first capacitor. The semiconductor chip, first coil and first capacitor are provided in a package. The first power supply circuit, first coil and first capacitor composes a first switching regulator. The semiconductor chip and the package are connected such that a first power supply voltage which will be produced by the first switching regulator is supplied to the first circuit area. A power supply voltage to the first power supply circuit is supplied from the outside of the semiconductor apparatus.

In accordance with the present invention, a semiconductor apparatus comprises a first semiconductor chip including a first circuit area and a controller of a first power supply circuit; a second semiconductor chip including an output unit of the first power supply circuit; a first coil; and a first capacitor. The first and second semiconductor chips, first coil and first capacitor are provided on a package. The first power supply circuit, first coil and first capacitor compose a first switching regulator. The first semiconductor chip and the package are connected such that a power supply voltage which will be produced by the first switching regulator is supplied to the first circuit area. A power supply voltage to the first power supply circuit is supplied from the outside of the semiconductor apparatus.

According to the present invention, the power supply circuit that supplies a large current to the semiconductor chip is built advantageously in the semiconductor apparatus.

Other objects, features and advantages of the invention will become apparent from the following description of the embodiments of the invention taken in conjunction with the accompanying drawings.

DESCRIPTION OF THE EMBODIMENTS

Figure 1:
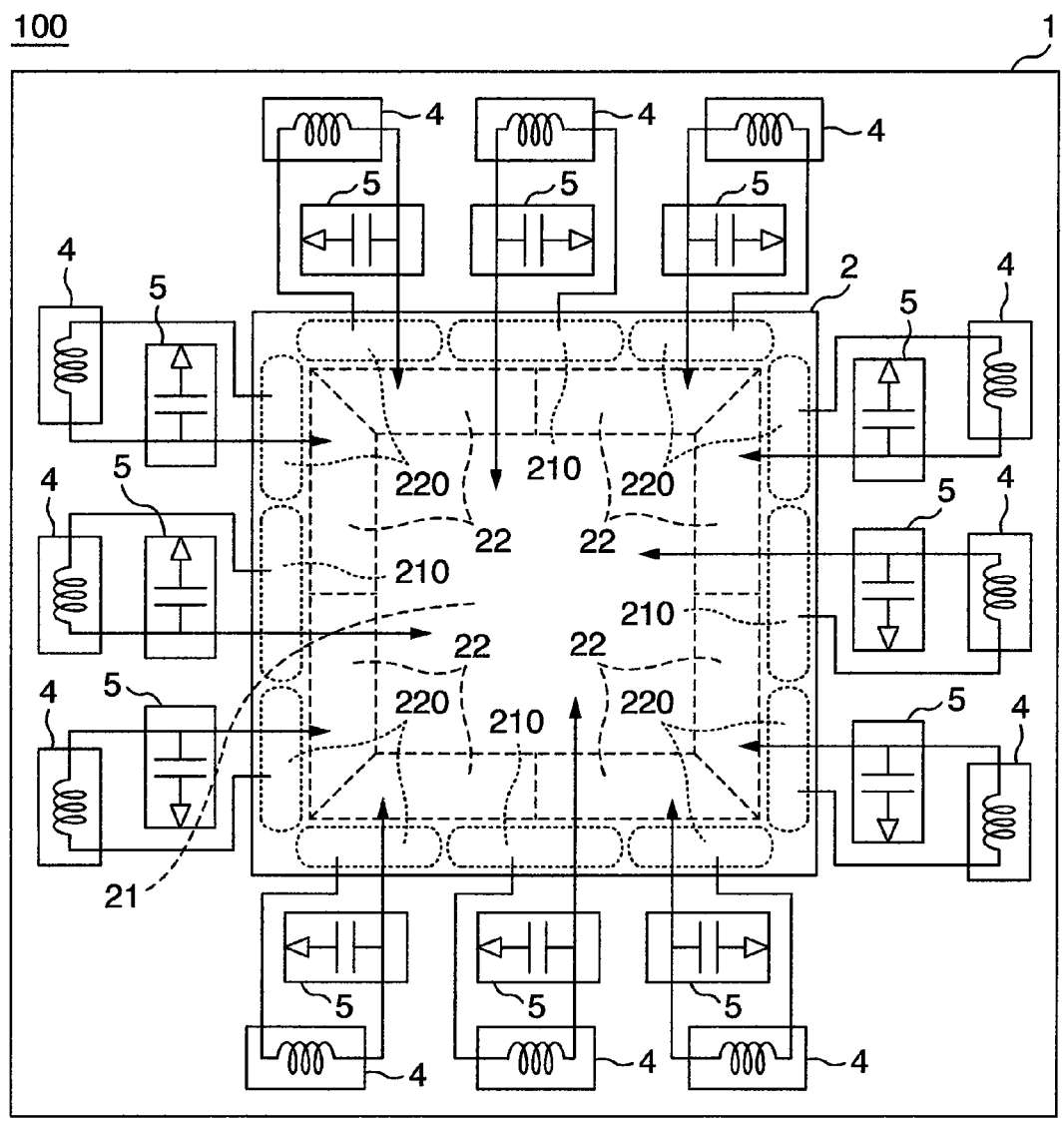
FIG. 1 illustrates the configuration of a semiconductor apparatus according to an embodiment of the present invention.

FIG. 1 illustrates the configuration of a semiconductor apparatus according to an embodiment of the present invention. Provided in a package 1 are a semiconductor chip 2, coils 4 and capacitors 5. The chip 2 includes a general logic circuit area 21 and interface circuit areas 22. The general logic circuit area 21 is the one on which are provided a logic circuit and/or a memory such as a so-called CPU and/or a RAM necessary for the semiconductor chip 2 to perform an arithmetic and operation process. Each interface circuit area 22 is the one in which is formed an input/output circuit over which the semiconductor chip 2 makes communication with another semiconductor chip. A power supply circuit of a switching regulator that supplies power to the general logic circuit area 21 is formed in a corresponding area 210. A power supply circuit of a switching regulator that supplies power to the interface circuit area 22 is formed in a corresponding area 220. FIG. 1 schematically illustrates that a coil 4 and a capacitor 5 are connected to a respective one of the power supply circuit areas 210 and 220 for the general logic circuit area 21 and the interface circuit areas 22. A power supply circuit formed in each of the areas 210 and 220, and related coil 4 and capacitor 5 are connected to form a switching regulator. The switching regulator produces a power supply voltage at the junction point of the coil 4 and capacitor 5 thereof in the package 1 and then supplies it to a related one of the general logic circuit area 21 and the interface circuit areas 22.

FIG. 1 illustrates an example in which the respective switching regulators involving the four power supply circuit areas 210 supply power supply voltages to the general logic circuit area 21 whereas the switching regulators involving the power supply circuit areas 220 supply power supply voltage to the corresponding interface circuit areas 22. The number of switching regulators that supply a power supply voltage to one circuit area is determined depending on power based on which the circuit formed in that circuit area operates normally and the capability of the regulators to supply power, and not limited by the example of FIG. 1. The general logic circuit area 21 may have the same power supply voltage as, or a different voltage from that of, the interface circuit area, but both the power supply circuits, including the main power supply lines through which power is supplied to the associated circuit areas, are preferably isolated from each other such that possible power supply noise occurring in the interface circuits is not transmitted to the power supplies for the general logic circuit. The power supply voltages which are supplied to the interface circuit areas may be the same or different from each other. Note that the power supply voltages for the interface are diversified. Thus, the interface circuit areas 22 are put in correspondence to their respective power supply circuit areas 220, as shown in FIG. 1, such that when the semiconductor chip 2 has a plurality of interface voltages, the number of restrictions on design is reduced and the design is facilitated advantageously.

While the general logic circuit area 21 is illustrated as supplied with one power supply voltage, it may be divided into a plurality of general logic circuit subareas to which respective different power supply voltages are supplied. In this case, the power supply circuit areas 210 for the general logic circuit area 21 may be composed so as to output different power supply voltages to the general logic circuit subareas, respectively. Alternatively, the arrangement may be such that power supply circuit areas 210 output power supply voltages to related ones of the plurality of general logic circuit subareas and the respective power supply voltages are stepped down by series regulators (not shown) such that resulting power supply voltages are supplied to the remaining ones of the general logic circuit subareas.

As will be described later with reference to FIG. 3, each of the power supply circuits 210, 220 of the switching regulators formed on the semiconductor chip 2 includes a circuit that detects a power supply voltage supplied thereto. As just described, since the power supply circuits of the switching regulators are disposed on the same semiconductor chip 2 on which the circuits to which the power supply voltages are supplied are provided, the switching regulators can produce the power supply voltages with high accuracy. In addition, since the coils and capacitors of the switching regulators are mounted on the package, the power supply voltages are produced within the package 1 and directly supplied to the semiconductor chip 2, thereby allowing a large current to be supplied to the chip 2.

The features of the FIG. 1 configuration are that the power supply circuit areas 210 and 220 are disposed along the outer peripheral part of the semiconductor chip 2. Thus, the area surrounded by the areas 210 and 220 may have the same configuration as the conventional semiconductor chip where no power supply circuits are built. Thus, when power supply circuits are built in an existing semiconductor integrated circuit, the existing layout need not be changed. In addition, the configuration of the power supply circuits in the outer peripheral part of the existing semiconductor integrated circuit advantageously reduces the man-hours. Also, when power supply circuits are to be built in a new semiconductor integrated circuit, the conventional method may be used in the layout of the semiconductor integrated circuit, thereby reducing the man-hours advantageously. The configuration of the power supply circuits in the outer peripheral part of the semiconductor chip serves to reduce the connection distance between each power supply circuit and the associated ones of the coils and capacitors disposed along the periphery of the semiconductor chip 2. Thus, a large current is allowed to be supplied to the semiconductor chip 2 by strengthening the electrical connection.

Figure 9A:
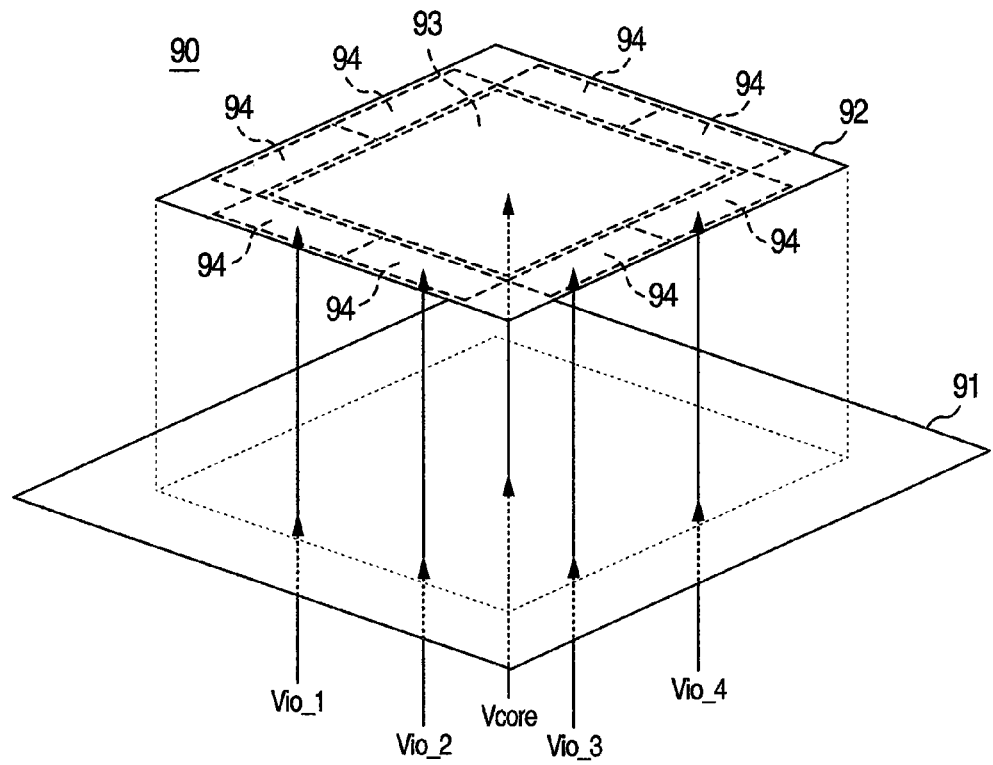
FIGS. 9A and 9B illustrate a prior art configuration for supply of power supply voltages to a semiconductor apparatus.
Figure 9B:
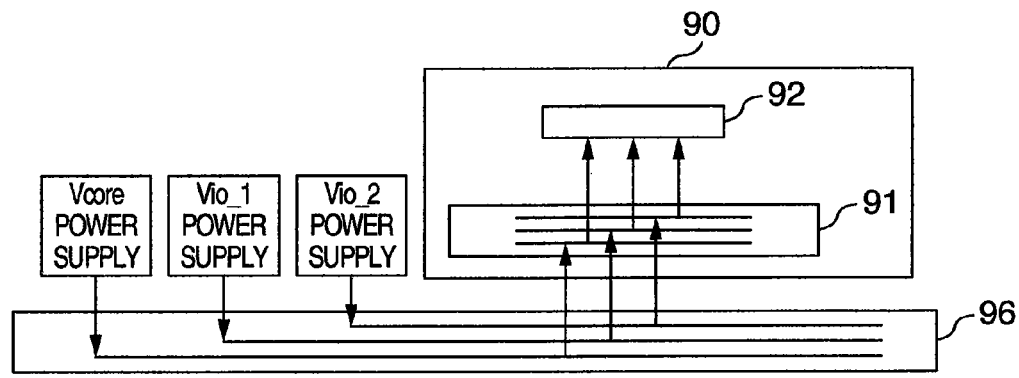

FIG. 9A illustrates a conventional method of supplying power to a semiconductor device. A semiconductor chip 92 of FIG. 9A includes a general logic circuit area 93 and interface circuit areas 94. FIG. 9A also illustrates four kinds of interface power supply voltages supplied from power supply pins (not shown) provided on a package 91 to a semiconductor chip 2. The general logic circuit area 93 is supplied with a power supply voltage Vcore, and interface circuit areas 94 (94a-d) with power supply voltages Vio_1, Vio_2, Vio_3 and Vio_4, respectively. As shown in FIG. 9B, generally, a plurality of (in FIG. 9B, only three) power supply circuits are mounted on a board 96 on which the semiconductor apparatus 90 is implemented so as to output power supply voltages Vcore, Vio_1, Vio_2, Vio_3 and Vio_4 to the semiconductor apparatus 90. In contrast, FIG. 2 illustrates supply of power to the inventive semiconductor apparatus. The semiconductor chip of FIG. 2 is the same multi-power supply chip as in FIG. 9, but implementation of the regulators in the package causes the semiconductor apparatus to appear as if it includes a single power supply.

Figure 2A:
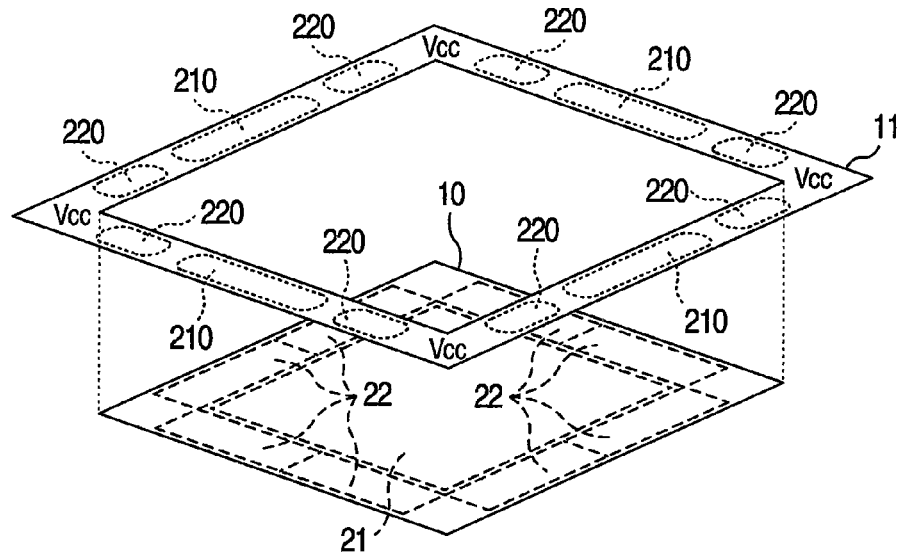
FIG. 2A illustrates the configuration of a semiconductor chip 2.
Figure 2B:
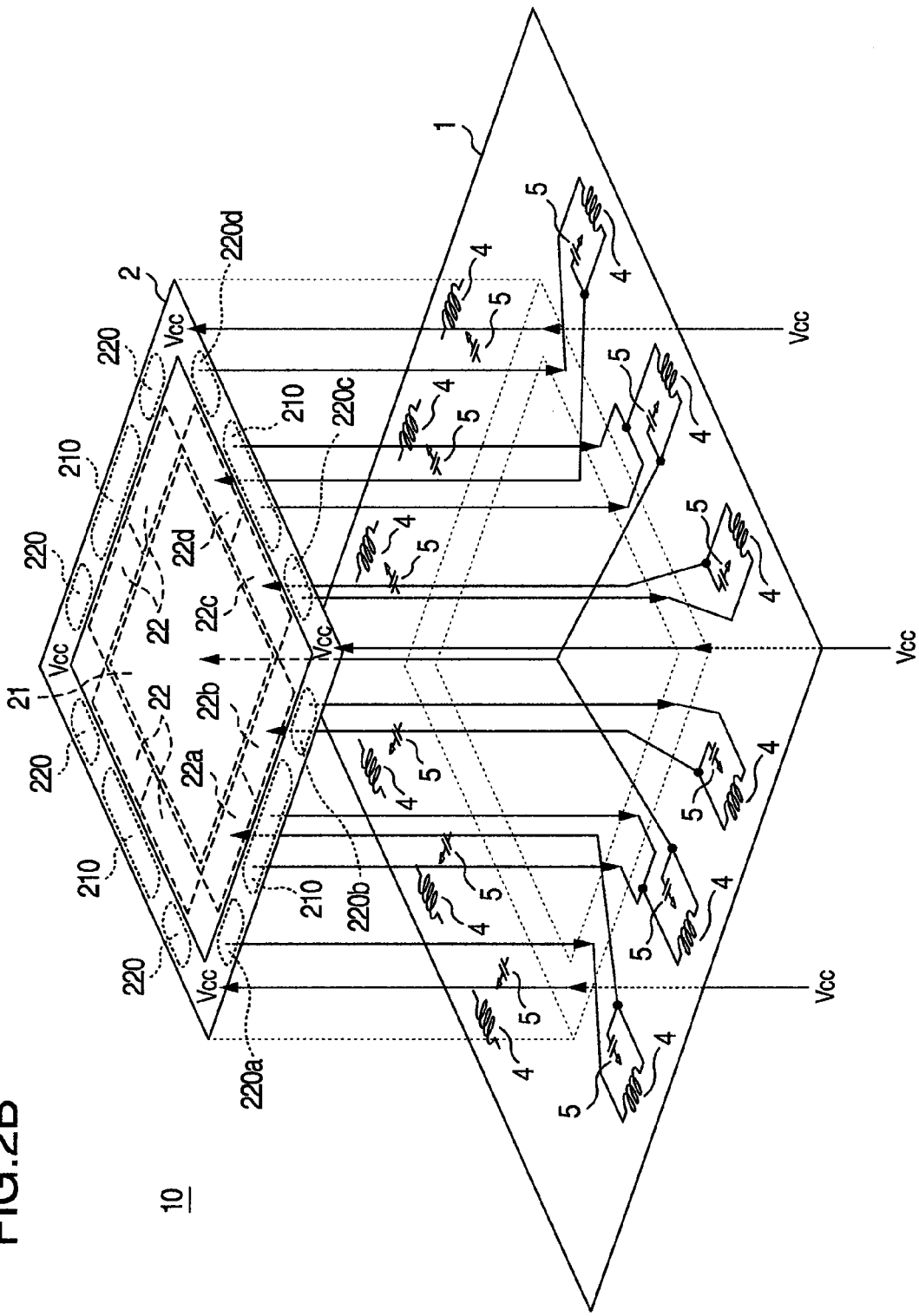
FIG. 2B illustrates a scheme for supply of a power supply voltage to the semiconductor apparatus 100.

FIG. 2A illustrates the configuration of the semiconductor chip 2, which includes an internal area 10 corresponding to the conventional semiconductor chip 92, and an external area 11. The internal area 10 includes a general logic circuit area 21 and interface circuit areas 22. The outer peripheral area 11 has power supply circuits 210 and 220 operating at a power supply voltage Vcc. FIG. 2B illustrates a power supply scheme to the semiconductor apparatus 100. Power voltages Vcc supplied externally to the semiconductor apparatus 100 are used as power voltages for the power supply circuits provided in the outer peripheral area 11 of the semiconductor chip 2. A power supply circuit 220a, a coil 4a and capacitor 5a compose a switching regulator, which produces a power supply voltage Vio_1, which is then supplied to an interface circuit area 22a. Other switch regulators having the same configuration as the last-mentioned switch regulator produces power supply voltages Vio_2, Vio_3 and Vio_4, which are then supplied to the corresponding interface circuits. The four switching regulators each composed of a power supply circuit 210, a coil 4 and a capacitor 5 produce a power supply voltage Vcore, which is then supplied to the general logic circuit area 21. FIG. 2 illustrates that the plurality of switching regulators each supply the power supply voltage Vcore, thereby increasing the power supply capacity. As will be obvious from this, in the inventive semiconductor apparatus, the power supply pins of the package 1 are required to supply only the power voltages Vcc to the power supply circuits 210 and 220. Each of the power supply circuits 210 and 220 disposed on the semiconductor chip 2, and a coil 4 and a capacitor 5 provided in the package 1 cooperate to produce a power voltage in the package, and then supplies it to a corresponding one of the circuit areas 21 and 22 of the semiconductor chip 2.

Figure 3:
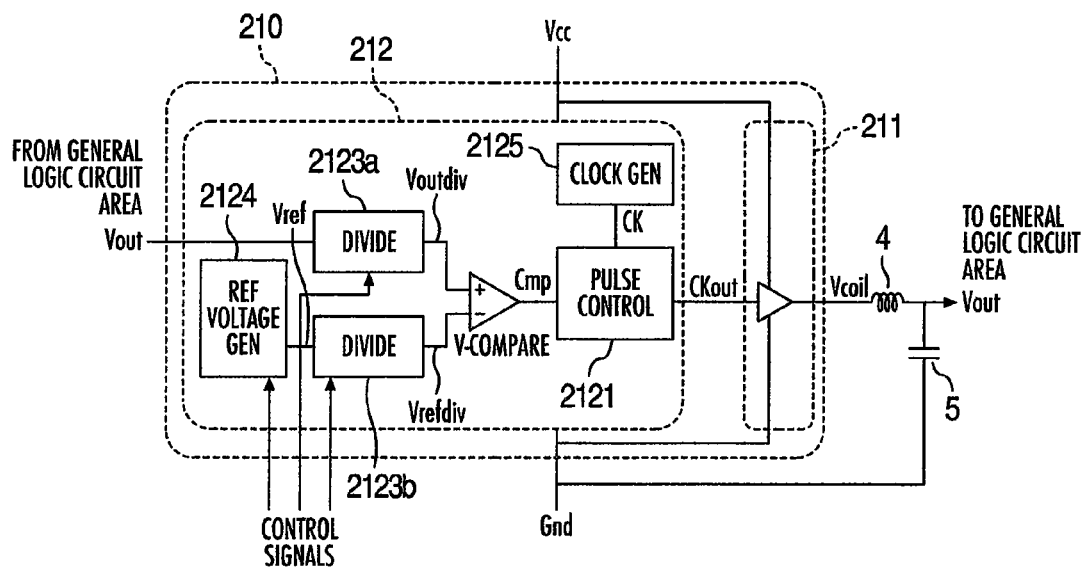
FIG. 3 illustrates the configuration of a power supply circuit 210 (220) as part of switching regulator.

FIG. 3 illustrates the configuration of a power supply circuit 210 that composes part of a switching regulator. The power supply circuit 210 includes a controller 212 and an output unit 211. The controller 212 includes a pulse control circuit 2121, a comparator 2122, a voltage divider 2123, a reference voltage generator 2124, and a clock pulse generator 2125. The power supply circuit of FIG. 3 is only exemplary and may be replaced with a known switching regulator circuit, of course.

The output of the switching regulator is determined based on the duty cycle of pulses that drive the coil 4 involved. The controller 212 feeds back thereto the magnitude of the power supply voltage supplied to the circuit area 21, thereby controlling the duty cycle of the pulses that drives the coil 4. The output unit 211 comprises a driver that receives an output from the controller 212 and drives the coil 4.

The controller 212 receives a power supply voltage Vout supplied to the circuit area 21. The comparator 2122 compares a voltage Voutdiv obtained by dividing the received power supply voltage Vout in a voltage subdivider 2123a with a voltage Vrefdiv obtained by dividing a reference voltage Vref, generated by the reference voltage generator 2124, on a voltage subdivider 2123b. The pulse control circuit 2121 modulates the pulse width of a clock pulse signal CK generated by the clock pulse generator 2125 and outputs a resulting pulse signal. More specifically, if the Voutdiv<the Vrefdiv, a pulse signal CKout including clock pulses CK of an increased width (increased duty cycle) is delivered to the output unit 211. Conversely, if the Voutdiv>the Vrefdiv, the pulse control circuit 2121 outputs a pulse signal CKout including clock pulses CK of a decreased width (decreased duty cycle) to the output unit 211.

The output unit 211 supplies a current based on the external power supply voltage Vcc or on the ground (or reference) potential Gnd to the smoothing circuit composed of coil 4 and capacitor 5 concerned in response to a pulse signal CKout from the pulse control circuit 2121 of the controller 212, thereby producing a power supply voltage Vout. The output voltage Vout includes a product of the voltage value of the power supply voltage Vcc and the duty cycle of the pulse signal CKout and is supplied as a power supply voltage to the circuit area 21. This supplied voltage is fed back to the controller 212. It is assumed that the voltage value of the reference voltage Vref and the voltage division ratio of the voltage divider 2123 are set (or trimmed) in accordance with control signals delivered to the reference voltage generator 2124 and the voltage subdividers 2123a and 2123b such that Voutdiv=Vrefdiv when the output voltage Vout becomes a desired power supply voltage value. At this time, the pulse signal CKout is converged so as to have a pulse width involving the duty cycle obtained by dividing a desired power supply voltage value as the output voltage Vout by the voltage value of the power supply voltage Vcc, and hence a desired power supply voltage output Vout is produced.

While the configuration and operation of the power supply circuit 210 is illustrated so far, they apply to each power supply circuit 220.

A reference voltage generator 2124 may be provided for each power supply circuit or shared by a plurality of power supply circuits. This choice is determined based on a spatial expanse to which the reference voltage generator supplies its reference voltage. If the spatial expanse is large, each reference voltage generator 2124 is provided for a respective power supply circuit because otherwise an error increases which occurs when the reference voltage is distributed. Conversely, when the spatial expanse is small, a single reference voltage generator may be shared by the plurality of power supply circuits.

Figure 4:
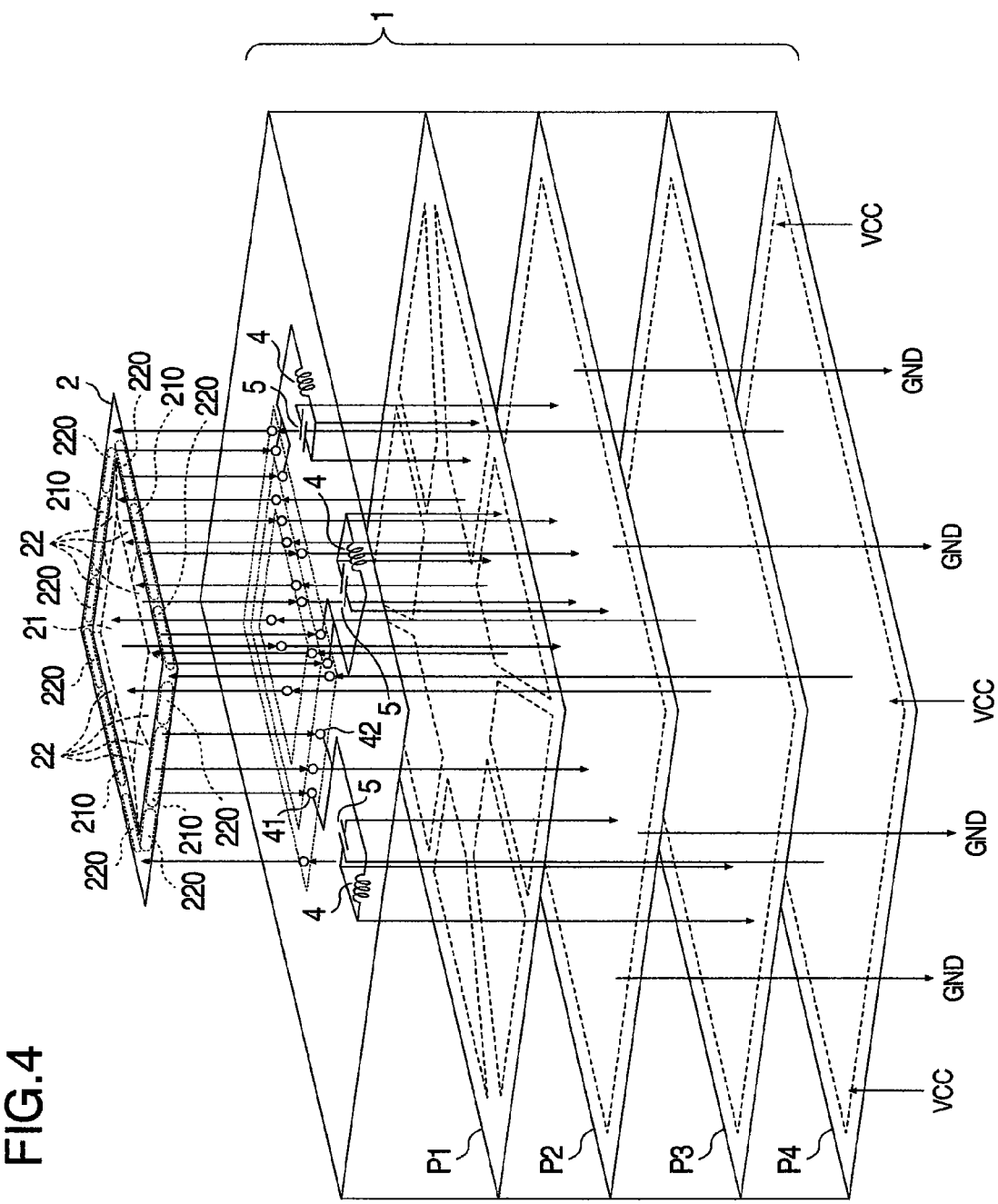
FIG. 4 illustrates the configuration of a package 1.

FIG. 4 illustrates the configuration of the package 1 including only the power supply system and omits general input/output signals from/to each interface circuit area 22 of the semiconductor chip 2. It is assumed that the semiconductor chip 2 is of a BGA (Ball Grid Array) type. In this case, the semiconductor chip 2 may be connected to the package 1 by wire bonding or a flip chip connection using solder bumps.

The externally supplied power supply voltages Vcc and the ground potential Gnd are supplied via a Vcc (power supply voltage) plane layer P4 and a Gnd (reference potential) plane layer P2 to the semiconductor chip 2 and then applied to the power supply circuits 210 and 220, which supply currents to the respective related smoothing circuits composed of coil 4 and capacitor 5 provided on the package 1, thereby producing power supply voltages at the respective junctions of coil 4 and capacitor 5. Outputs from the general logic circuit switching regulators are supplied via the general logic core power supply plane layers P3 to the semiconductor chip 2 as power supplies for the general logic circuit area 21. Outputs from the interface circuit switching regulators are supplied via the interface circuit I/O power supply plane layers P1 to the semiconductor chip 2 as power supplies for the interface circuit area 22. The interface circuit I/O power supply plane layer P1 is separated into layer sectors each for a respective one of the interface circuits of the semiconductor chip 2, which facilitates to get compatible with various interface specifications.

In order for power supply lines or signal lines to bore through the plane layers, holes are provided on the plane layers so as not to short-circuit. Thus, in particular areas of the plane layers that many lines are bored through, the plane layers have many close net-line holes formed therein.

FIG. 4 shows that the power supply circuits formed on the semiconductor chip 2 are connected at a plurality of connection points or pads with a like number of smoothing circuits composed of a coil 4 and a capacitor 5 provided on the package 1 (for example, a coil 4e is connected to a power supply circuit 210e at connection points 41 and 42.). This example is preferable in the case of a flip chip connection using solder bumps. With the solder bumps, a quantity of current which can pass through one bump is limited. Thus, connection of the output of the power supply circuit to the coil of the smoothing circuit concerned at a plurality of points serves to reduce a quantity of current flowing through one connection point.

Figure 5A:
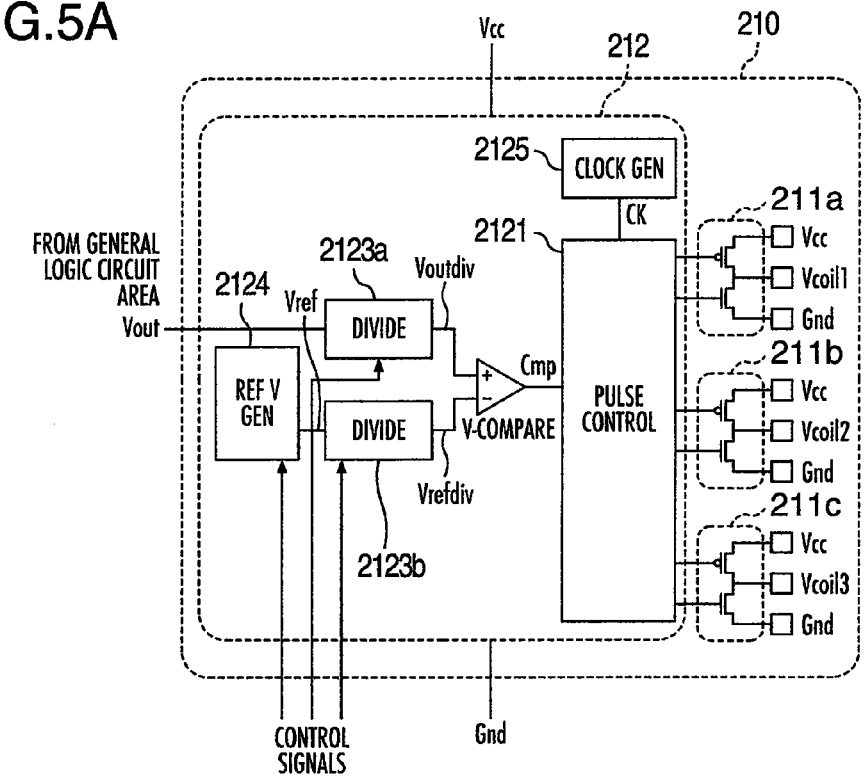
FIG. 5A illustrates the configuration of a power supply circuit with a plurality of connection points.

The configuration of the power supply circuit 210 (or 220) in this case is shown in FIG. 5A. In this example, the power supply circuit 210 (or 220) is connected to a single coil at three points Vcoil1, Vcoil2 and Vcoil3. The output units 211a-c each are a push-pull output circuit arranged such that PMOS and NMOS transistors of the output units are turned on in a complementary manner in response to a pulse signal CKout from the pulse control circuit 2121, thereby outputting to a coil output Vcoil a current from either of the external power supply terminal Vcc and the ground terminal Gnd. By disposing the plurality of outputs in the dispersed manner so as to supply a single coil with currents in a parallel manner, as just mentioned above, concentration of the currents is avoided and the switching regulator is capable of supplying a large current.

Figure 5B:
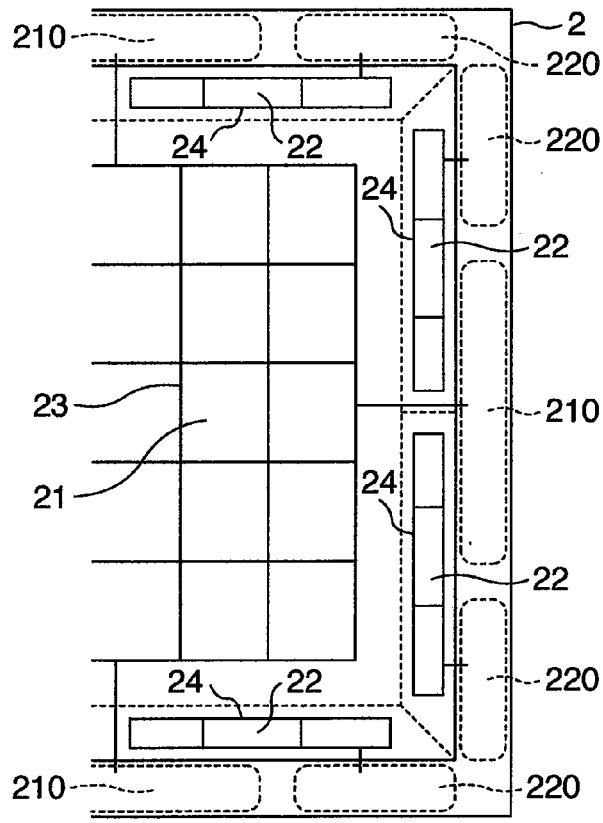
FIG. 5B illustrates wiring in a general logic circuit area and an interface circuit area.

FIG. 5B illustrates power supply lines 23 and 24 disposed in the general logic circuit area 21 and the interface circuit areas 22, respectively. In this example, the power supply lines 23 and 24 are disposed in a mesh-like manner in order to supply power to the circuits of the respective areas and a part of the power is arranged to be fed back to the power supply circuits 210 and 220.

Figure 6:
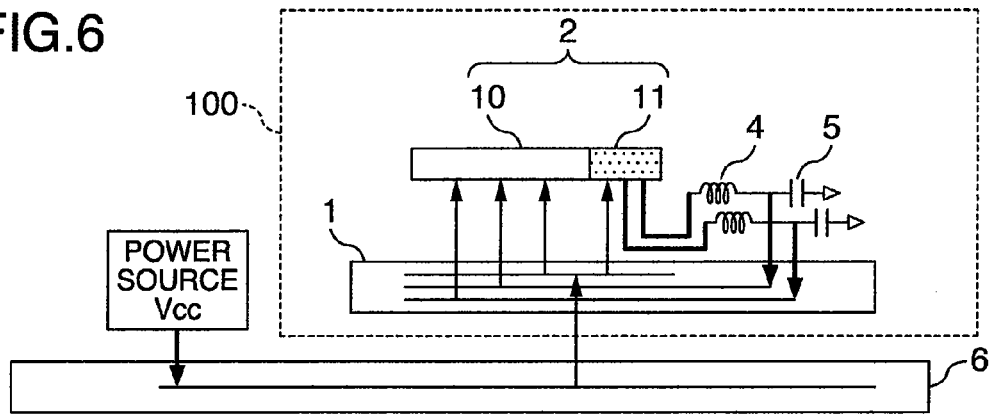
FIG. 6 illustrates connections in a power supply system wherein a semiconductor chip having built-in power supply circuits is implemented on a board.

FIG. 6 illustrates connection of a power supply system in which a semiconductor chip having a built-in power supply circuit is implemented on a board. First, referring to FIGS. 9A and 9B, a prior art semiconductor apparatus implemented on a board 96 will be described. In FIG. 9B, a plurality of power supply circuits are provided on the board 96 so as to supply power supply voltages via the board 96 and a package 91 to a semiconductor chip 92. In order to supply a large current, using this configuration, the width of the power supply lines is desired to increase in order to reduce the resistance of the power supply lines on the board. However, since there are general input/output signal lines for use in the semiconductor integrated circuit, the width of these lines cannot increase so greatly and hence a large current is difficult to supply.

As shown in FIG. 6, with the semiconductor chip 2 having a plurality of power supply circuits built therein, only one power supply circuit which supplies Vcc is provided on the board 6. This Vcc is supplied via the board 6 and package 1 to each of the power supply circuits provided in the outer peripheral area 11 of the semiconductor chip 2. A switching regulator composed of that power supply circuit and a related smoothing circuit, composed of a coil 4 and a capacitor 5 on the package 1, produces a smoothed voltage in the package 1. This power supply voltage is then supplied to a corresponding circuit provided within an inner area 10 of the semiconductor chip 2.

Supply of power from the package 1 to the semiconductor chip 2 is performed in the same manner as in the conventional semiconductor apparatus as long as the plane layers of the package 1 are used. Note that in the prior art configuration a power supply voltage is supplied from each of the power supply circuits provided on the board to the plane layers of the package whereas in the present invention a power supply voltage produced in the package is supplied to the plane layers of the package. Like this, producing a power supply voltage in the vicinity of an element that consumes the power supply current enables a large current to be supplied.

Figure 7:
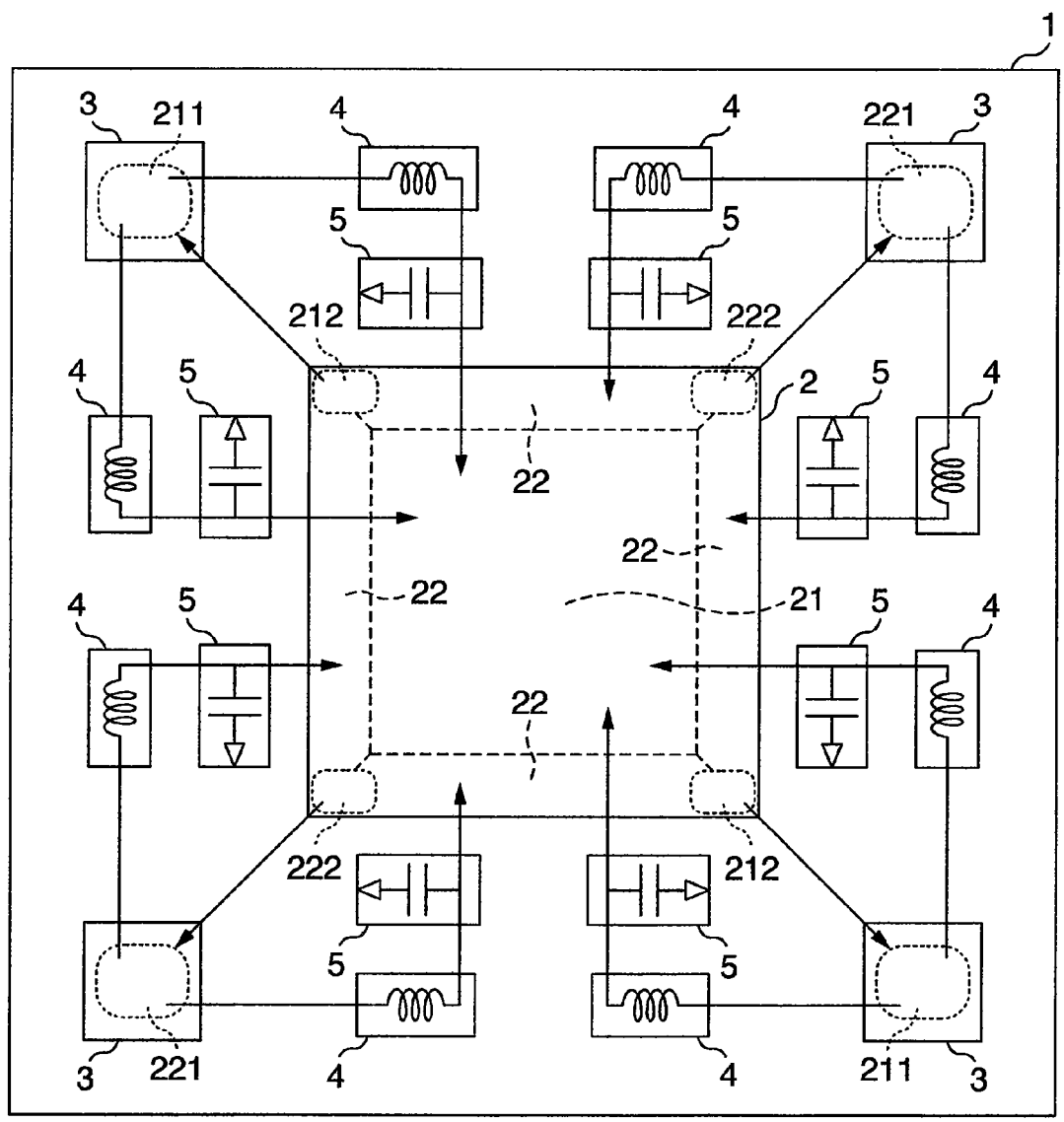
FIG. 7 shows a modification of the power supply circuit of the FIG. 1 embodiment.

FIG. 7 illustrates a modification of the power supply circuits in the semiconductor apparatus of FIG. 1. In FIG. 7, an element having the same function as illustrated in FIG. 1 is denoted by the same reference numeral as used in FIG. 1. The features of the FIG. 7 configuration are that the same controller 212 as provided in each power supply circuit 210 (or 220) which is implemented in the semiconductor chip 2 in FIG. 1 is formed on a semiconductor chip 2 of FIG. 7; that the same output unit 211 as provided in that power supply circuit 210 (or 220) of FIG. 1 is formed on another semiconductor chip 3; and that the semiconductor chip 2 and one or more semiconductor chips 3 are implemented on the package 1. In each power supply circuit 210 (or 220), the output unit 211 consumes power most and includes transistors having a very long overall length W. The controller 212 can be composed of miniaturized transistors. To this end, the output unit 211 is composed of a semiconductor chip separate from the semiconductor chip 2. In this case, the minimum processed dimensions of the semiconductor chip 3 that forms the output unit 211 may be larger than those of the semiconductor chip 2.

In FIG. 7, the four controllers 212 of the power supply circuits 210 (or 220) are disposed at the respective corners of the square semiconductor chip 2 to avoid occurrence of gaps in these corners there, and four semiconductor chips 3 in which only the output units 211 are implemented are disposed at the respective corners of the square package 1 in the vicinity of the controllers 212.

In this configuration, the controllers 212 of the power supply circuits are disposed on the same semiconductor chip as the circuits to which the power is supplied. Thus, this configuration has the same detection accuracy of power supply voltage as that of FIG. 1. Further, since the output units 211 are provided on the separate chip 3 from the chip 2, the size of the semiconductor chip 2 is prevented from increasing. By using the output units 211, whose miniaturization is not required, as a separate dedicated chip in the semiconductor apparatus having built-in power supply circuits, the cost is reduced. By providing the four semiconductor chips dedicated for the output units at the corresponding corners of the package, the power supply lines are dispersed advantageously and disposed in the package easily.

While in the example of FIG. 7 the power supply circuits are illustrated as disposed at the corners of the semiconductor chip 2, the present invention is not limited to this particular case. The configurations illustrated with reference to other drawings may be used as long as no contradictions occur. For example, the semiconductor chip 3 may be supplied with the same power supply voltage Vcc as the semiconductor chip 2, for example, via plates P4/P2 of the package 1 shown in FIG. 4. The output unit may be divided into a plurality of output subunits (for example, 211a, 211b and 211c,) as shown in FIG. 5 and connected to a like number of coils at corresponding points (or pads).

Figure 8:
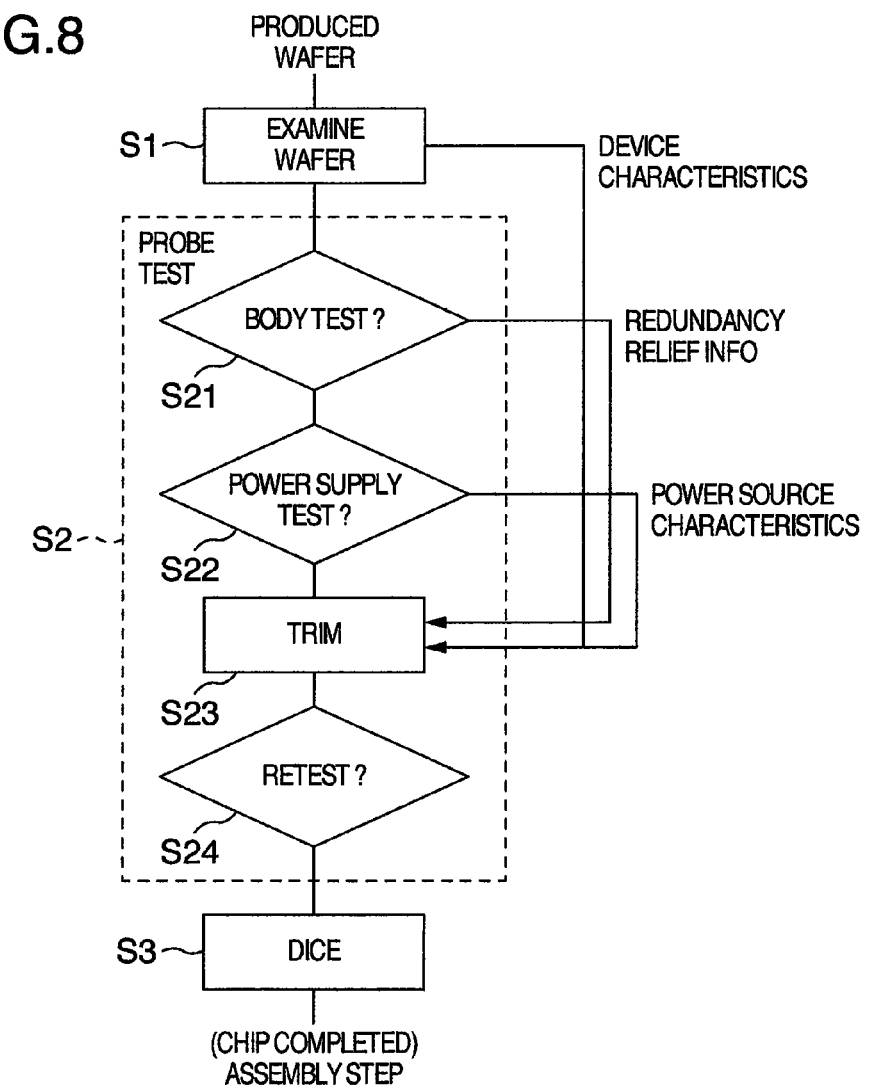
FIG. 8 is a flowchart indicative of a method of examining a wafer on which a semiconductor chip is formed.

FIG. 8 illustrates a method of examining a wafer on which is formed the semiconductor chip 2 applied to the semiconductor apparatus according to the present invention. First, the wafer is examined for device performance at a level thereof (S1), and then it is determined whether the wager is acceptable in a probe test (S2). In this probe test, a body test is performed which examines defects in memories included in the circuit concerned to relieve them (S21), and then the power supply circuits formed on the semiconductor chip 2 are tested for acceptability (S22). In a trimming step (S23), the redundancy relief of the memories is performed based on a result of the body test, and the power supply circuits are then corrected based on the device characteristics obtained in the wafer examination. More specifically, when the device characteristics are good in the wafer examination, the values of the voltages produced by the power supply circuits (i.e., the values of the reference voltages produced by the reference power supply generators 2124 concerned) are set to a low value, which reduces the power consumed in the semiconductor chip 2 without causing any problems in the circuit performance. Conversely, when no satisfactory device characteristics are obtained in the wafer examination, the values of voltages produced by the power supply circuits (or the values of the reference voltages produced by the reference power supply generators 2124) are set to a higher value, which increases an operating margin of the circuit performance. After trimming, a retest is performed (S24), the wafer is diced (S3) into chips, which are then transferred to an assembling step.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor apparatus comprising:
a semiconductor chip including a first circuit area and a first power supply circuit;
a first coil; and
a first capacitor,
wherein the semiconductor chip, the first coil, and the first capacitor are provided in a package,
wherein the first power supply circuit, the first coil, and the first capacitor are parts of a first switching regulator,
wherein the semiconductor chip and the package are connected such that a first power supply voltage produced by the first switching regulator is supplied to the first circuit area,
wherein the first power supply circuit is supplied with a power supply voltage from the outside the semiconductor apparatus,
wherein the first power supply circuit is connected to the first coil via a plurality of connection points, and
wherein the semiconductor chip is connected to the package by a bump.

2. The semiconductor apparatus of claim 1, wherein the first power supply circuit is disposed at an outer peripheral portion of the semiconductor chip.

3. The semiconductor apparatus of claim 1, further comprising:
a second coil; and
a second capacitor,
wherein the second coil and the second capacitor are provided in the package,
wherein the semiconductor chip further includes a second circuit area and a second power supply circuit,
wherein the second power supply circuit, the second coil, and the second capacitor are parts of a second switching regulator,
wherein the semiconductor chip and the package are connected such that a second power supply voltage produced by the second switching regulator is supplied to the second circuit area, and
wherein the second power supply circuit is supplied with the power supply voltage from outside the semiconductor device.

4. The semiconductor apparatus of claim 3, wherein:
the first circuit area has a logic circuit and a memory formed therein;
the second circuit area has an input/output circuit formed therein; and
the second circuit area being provided between the first circuit area and an outer peripheral portion of the semiconductor chip.

5. The semiconductor apparatus of claim 3, wherein:
the package comprises first through fourth plane layers;
the first plane layer being supplied with the power supply voltage from outside the semiconductor apparatus;
the second plane layer being supplied with a reference voltage from outside the semiconductor apparatus;
the third plane layer being supplied with the first power supply voltage produced by the first switching regulator; and
the fourth plane layer being supplied with the second power supply voltage produced by the second switching regulator.

6. The semiconductor apparatus of claim 1, wherein:
the first power supply circuit comprises:
a reference voltage generator that generates a reference voltage;
a voltage comparator that compares the reference voltage with a power supply voltage fed back from the first circuit area;
a pulse control circuit that changes a duty cycle of a clock signal based on a result of the comparison by the voltage comparator and outputs a resulting signal; and
an output unit that drives the first coil with the resulting signal.

7. The semiconductor apparatus of claim 6, wherein the first power supply voltage is trimmed by adjusting a setting of the reference voltage generator or the voltage comparator.

8. A semiconductor apparatus comprising:
a first semiconductor chip including a first circuit area and a controller of a first power supply circuit;
a second semiconductor chip including an output unit of the first power supply circuit;
a first coil; and
a first capacitor,
wherein the first and second semiconductor chips, the first coil, and the first capacitor are provided in a package,
wherein the first power supply circuit, the first coil, and the first capacitor are parts of a first switching regulator;
wherein the first semiconductor chip and the package are connected such that a first power supply voltage produced by the first switching regulator is supplied to the first circuit area, and
wherein the first power supply circuit is supplied with a power supply voltage from outside the semiconductor apparatus.

9. The semiconductor apparatus of claim 8, further comprising:
an input/output circuit disposed at an outer peripheral portion of the first semiconductor chip; and
a logic circuit and a memory formed in the first circuit area,
wherein the controller of the first power supply circuit is disposed least a first of four corners of the outer peripheral portion of the first semiconductor chip, and
wherein the second semiconductor chip is disposed in the vicinity of the first corner of the first semiconductor chip where the controller of the first power supply circuit is disposed.

10. The semiconductor apparatus of claim 9, further comprising:
a third semiconductor chip having an output of a second power supply circuit;
a second coil;
a second capacitor; and
a controller of the second power supply circuit disposed on the first semiconductor chip,
wherein the third semiconductor chip, the second coil, and the second capacitor are provided in the package,
wherein the first semiconductor chip comprises the controller of the second power supply circuit,
wherein the second power supply circuit, the second coil, and the second capacitor are parts of a second switching regulator,
wherein the third semiconductor chip and the package are connected such that a second power supply voltage produced by the second switching regulator is supplied to the input/output circuit, and wherein the second power supply circuit is supplied with the power supply voltage from the outside the semiconductor apparatus.

11. The semiconductor apparatus of claim 10, wherein:
the controller of the second power supply circuit is disposed at least one of the remaining corners of the outer peripheral portion of the first semiconductor chip other than the first corner where the controller of the first power supply is disposed; and
the third semiconductor chip is provided in the vicinity of the at least one remaining corner of the first semiconductor chip where the controller of the second power supply circuit is disposed.

12. The semiconductor apparatus of claim 10, wherein:
the package comprises first through fourth plane layers;
the first plane layer being supplied with the power supply voltage from outside the semiconductor apparatus;
the second plane layer being supplied with a reference voltage from outside the semiconductor apparatus;
the third plane layer being supplied with the first power supply voltage produced by the first switching regulator; and
the fourth plane layer being supplied with the second power supply voltage produced by the second switching regulator.

13. The semiconductor apparatus of claim 8, wherein the second semiconductor chip is connected to the first coil via a plurality of connection points.

14. The semiconductor apparatus of claim 13, wherein the second semiconductor chip is connected to the package by a bump.

15. The semiconductor apparatus of claim 8, wherein the second semiconductor chip has minimum processed dimensions larger than the first semiconductor chip.

16. The semiconductor apparatus of claim 8, wherein:
the controller of the first power supply circuit comprises:
a reference voltage generator that generates a reference voltage;
a voltage comparator that compares the reference voltage with a power supply voltage fed back from the first circuit area; and
a pulse control circuit that changes a duty cycle of a clock signal based on a result of the comparison by the voltage comparator.

17. The semiconductor apparatus of claim 16, wherein the first power supply voltage is trimmed by adjusting a setting of the reference voltage generator or voltage comparator.

* * * * *